US005754484A

United States Patent [19]
Perreault

[11] Patent Number: 5,754,484
[45] Date of Patent: May 19, 1998

[54] APPARATUS AND METHOD FOR UTILIZATION OF LIMITED WRITE MEMORY

[75] Inventor: John A. Perreault, Hopkinton, Mass.

[73] Assignee: Motorola Inc., Schaumburg, Ill.

[21] Appl. No.: 645,308

[22] Filed: May 13, 1996

[51] Int. Cl.$^6$ .................................................. G11C 13/00
[52] U.S. Cl. ......................................... 365/200; 365/230.04
[58] Field of Search ........................ 365/189.04, 189.07, 365/230.01, 230.03, 230.04, 200

[56] References Cited

U.S. PATENT DOCUMENTS 4,862,421   8/1989   Tran ................................. 365/189.07

*Primary Examiner*—Terrell W. Fears
*Attorney, Agent, or Firm*—Nancy R. Gamburd; Jeffrey T. Klayman

[57] ABSTRACT

An apparatus (101, 110) and method provide for memory utilization and management which may expand the number of write operations for limited write memories, such as non-volatile memory, to provide for more optimal performance of systems such as computer or communication systems. Such memory utilization, in accordance with the present invention, includes allocating portions of the limited write memory, as a memory structure, for an ordinal or parameter designation. Upon system initialization or start up, comparison of adjacent ordinal designations may then be utilized to precisely locate the area of memory into which data or other information was previously written, indicating the current memory locations for current read operations, and to precisely locate the area of memory into which data or other information is to be written next, in order to provide the proper memory location for a subsequent write operation. The ordinal designation also provides for tracking the number of write operations performed in a given memory location, to prevent overuse of a given memory location and concomitant potential loss of data. In the preferred embodiment, the apparatus includes a processor (150) and memory (155), which includes a working memory and a limited write memory.

18 Claims, 5 Drawing Sheets

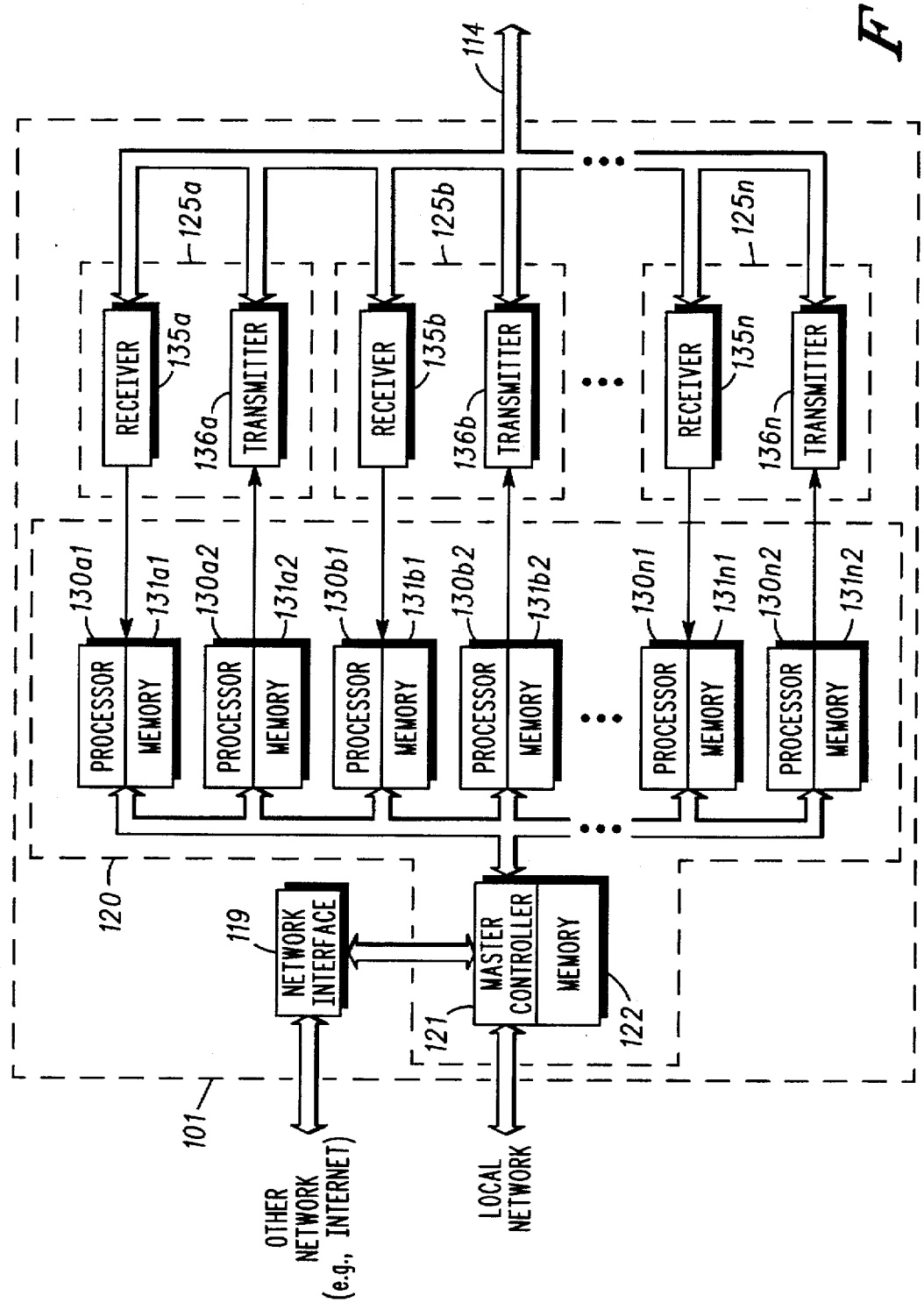

APPARATUS AND METHOD FOR UTILIZATION OF LIMITED WRITE MEMORY

FIELD OF THE INVENTION

This invention relates, in general, to memory usage in computer and communication systems and devices and, more specifically, to an apparatus and method for utilization of limited write memory.

BACKGROUND OF THE INVENTION

With the advent of multimedia communications, data transmission has become increasingly complex. For example, multimedia communications applications such as real time transmission of digitally encoded video, voice, and other forms of data, may require new forms and systems for data communication and data transmission. One such new communication system is the CableComm™ System currently being developed by Motorola, Inc. In the CableComm™ System, a hybrid optical fiber and coaxial cable is utilized to provide substantial bandwidth over existing or new cable lines to secondary stations such as individual, subscriber access units, for example, subscriber access units located in households having new or preexisting cable television capability. These coaxial cables are further connected via fiber optical cables to a central location having centralized, primary (or "head end") controllers or stations having receiving and transmitting capability. Such primary equipment may be connected to any variety of networks or other information sources, from the Internet, various on line services, telephone networks, to video/movie subscriber service. With the CableComm™ System, digital data may be transmitted both in the downstream direction, from the primary station or controller (connected to a network) to the secondary station of an individual user (subscriber access unit), and in the upstream direction, from the secondary station to the primary station (and to a network).

In the CableComm™ System, downstream data is currently intended to be transmitted using 64 quadrature amplitude modulation ("QAM") at a rate of 30M bps (megabits per second), at 5M symbols/second utilizing 6 bits/symbol, over channels having 6 MHz bandwidth in the frequency spectrum of 50–750 MHz. Anticipating asymmetrical requirements with large amounts of data tending to be transmitted in the downstream direction rather than the upstream direction, less capacity is provided for upstream data transmission, using π/4 differential quadrature phase shift keying (π/4-DQPSK) modulation in the frequency band from 5–42 MHz, with a symbol rate of 384 k symbols/sec with 2 bits/symbol. In addition, the communication system is designed to have a multipoint configuration, i.e., many end users (secondary stations, also referred to as subscriber access units) transmitting upstream to a primary station, with one or more primary stations transmitting downstream to the secondary stations. The communication system is also designed for asynchronous transmission, with users transmitting and receiving packets of encoded data, such as video or text files. In addition, it is also highly likely that transmission may be bursty, with various users receiving or transmitting data at indeterminate intervals over selected channels in response to polling, contention, or other protocols from the primary station, rather than transmitting a more continuous and synchronous stream of information over a dedicated or circuit switched connection.

For such a communication system with multiple upstream and downstream channels, it is highly desirable to provide for appropriate or optimal spectrum management, during which consumers (end-users), via secondary stations, may be switched from channel to channel, depending upon conditions such as load balancing across various transmit and receive channels, channel (or spectrum) allocation under various types of noise or other error conditions, and for channel (or spectrum) allocation under various types of congestion conditions. In addition, it is highly desirable to optimize other transmission parameters, such as changes in power levels for transmission, adaptive and changing levels of forward error correction, and changes in other transmission or modulation parameters. Such potential changes and adaptations, however, typically utilize memory locations for storing the current values and levels, such as the current transmit and receive channels, the current power level, and the current type or level of forward error correction. In addition, it is also useful in such systems to maintain historical (past) information regarding these values, for current use. For example, past channel usage information may be significant to help determine the current location of an assigned channel, as disclosed in a related U.S. patent application, entitled "Apparatus and Method for Channel Acquisition in a Communication System", Motorola Docket No. CXO96011, filed Mar. 28, 1996. In order to use such current and historical information, it is highly desirable to store such information in types of memory, generally referred to as non-volatile memory, such as $E^2PROM$ (electronically erasable, programmable read only memory), which maintain such information without the continued maintenance of power to the device, such as in between usage sessions, when the user has turned off the device. Similar considerations also apply to storage of any frequently changing variable, for any type of system, including those which are not directed toward data and other information communications, when the variable is to be stored when device power is off or through other types of power outages.

Usage of these types of memories, however, is currently limited in affordable integrated circuits ("ICs"). The typical non-volatile memory is limited to approximately 100,000 write (or storage) operations. While more expensive memory integrated circuits are available, their cost is typically prohibitive for use in some commercial products and, moreover, these memory ICs also are limited to a predetermined number of write operations and, accordingly, eventually suffer from similar limitations. The prior art solution to the limited number of write operations has been to limit or avoid such write operations altogether, potentially at the expense of improving system performance. For example, in the prior art, changes in power levels would be recorded less frequently, or only large changes would be recorded, or recording would be avoided altogether, due to the limitations in write operations to non-volatile memory. Upon system start-up, when powered on, such systems typically initialize to predetermined levels, without the benefit of past information which might have been stored, and as a consequence, may have or provide less than optimal performance. Accordingly, a need has remained to provide for a method and apparatus for utilization and management of limited write memory, which may expand the number of write operations for limited write memories such as non-volatile memories, to provide for more optimal performance of devices and systems such as computers and communications systems.

BRIEF DESCRIPTION OF THE DRAWINGS

FIG. 2 is a block diagram illustrating a primary station apparatus in accordance with the present invention.

DETAILED DESCRIPTION OF THE INVENTION

As mentioned above, a need has remained to provide for memory utilization and management which may expand the number of write operations for limited write memories, such as non-volatile memories, to provide for more optimal performance of emerging communications systems, such as the CableComm™ system. Such memory utilization, in accordance with the present invention, includes allocating or defining portions of the limited write memory, as a memory structure, for an ordinal designation. Comparison of adjacent ordinal designations may then be utilized to precisely locate the area of memory previously written to and to be written to next, in order to provide the proper memory location for a current read operation and a subsequent write operation. The ordinal designation also provides for tracking the number of write operations performed in a given memory location, to prevent overuse of a given memory location and concomitant potential loss of data. Such a memory structure and ordinal designation methodology provides for the ability to utilize each memory location up to its maximal number of write operations.

Figure 1:
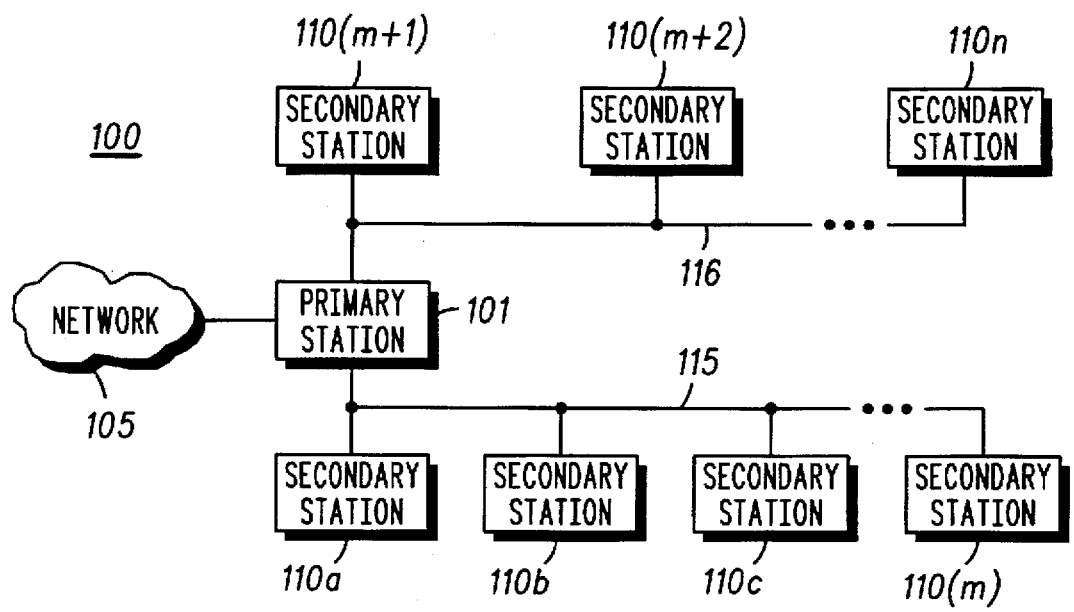
FIG. 1 is a block diagram illustrating a communication system in accordance with the present invention.

FIG. 1 is a block diagram illustrating a communication system 100 in accordance with the present invention, such as a multipoint communication system. As illustrated in FIG. 1, a primary station 101, also referred to as a primary transceiver unit 101, is coupled to a plurality of secondary stations $110_a$ through $110_n$, via communication media 115 and 116. In the preferred embodiment, communication media 115 and 116 are hybrid optical fiber and coaxial cable. In other embodiments, the communication media may be coaxial cable, fiber optic cable, twisted pair wires, and so on, and may also include air, atmosphere or space for wireless and satellite communication. The primary station 101 is also coupled to a network 105, which may include networks such as the Internet, on line services, telephone and cable networks, and other communication systems. The secondary stations $110_a$ through $110_n$ are illustrated in FIG. 1 as connected to the primary station 101 on two segments or branches of a communication medium, such as communication media 115 and 116. Equivalently, the secondary stations $110_a$ through $110_n$ may be connected to more than one primary station, and may be connected to a primary station (such as primary station 101) utilizing more or fewer branches, segments or sections of any communication medium.

Continuing to refer to FIG. 1, in the preferred embodiment, the communication medium, such as communication media 115 and 116, has or supports a plurality of communication channels. For ease of reference, the communication channels in which a primary station, such as the primary station 101, transmits information, signals, or other data to a secondary station, such as secondary station $110_n$, are referred to as downstream channels or downstream communication channels. Also for ease of reference, the communication channels in which a secondary station, such as secondary station $110_n$, transmits information, signals, or other data to a primary station, such as primary station 101, are referred to as upstream channels or upstream communication channels. These various upstream and downstream channels may, of course, be the same physical channel or may be separate physical channels, for example, through time division multiplexing or frequency division multiplexing. These various channels may also be logically divided in other ways, in addition to upstream and downstream directions. As mentioned above, in the preferred embodiment of the CableComm™ System, the communication medium is hybrid fiber coaxial cable, with downstream channels in the frequency spectrum of 50–750 MHz, and with upstream channels in the frequency band from 5–42 MHz.

FIG. 2 is a block diagram illustrating a primary station 101 in accordance with the present invention. The primary station 101 (also referred to as a primary transceiver) is coupled to a communication medium 114 for upstream and downstream communication to one or more secondary stations (not illustrated), and is coupleable to a network, such as the Internet, through a network interface 119. The primary station includes a processor arrangement 120 which is connected to a plurality of channel interfaces, channel interface $125_a$ through channel interface $125_n$, for communication over the communication medium 114. The processor arrangement 120 includes a master controller 121 having or connected to memory 122, and one or more additional processors $130_{a1}$ through $130_{n2}$ and corresponding associated memories $131_{a1}$ through $131_{n2}$. In the preferred embodiment, the master controller 121 is a Motorola M68040 processor, and the memory 122 is 16 MB RAM. The master controller 121 performs a variety of higher level functions in the preferred embodiment, such as the spectrum management of the present invention, plus other functions such as routing, management of secondary stations, and communication protocol management (such as SNMP management). The master controller 121 is connected to a plurality of other processors, collectively referred to as processors 130 and separately illustrated as processor $130_{a1}$, processor $130_{a2}$, through processor $130_{n1}$ and processor $130_{n2}$. Each of these processors, processor $130_{a1}$, processor $130_{a2}$, through processor $130_{n1}$ and processor $130_{n2}$, is also coupled to or contains corresponding memory circuits, memory $131_{a1}$, memory $131_{a2}$, through memory $131_{n1}$ and memory $131_{n2}$. In the preferred embodiment, each of these processors 130 are also Motorola M68040 processors, while the corresponding memory circuits, memory $131_{a1}$ through memory $131_{n2}$, are 4 MB RAM. In the preferred embodiment, the processors 130 perform such functions related to upstream and downstream data protocols, such as sending a poll message or an acknowledgment message downstream. Each of these processors $130_{a1}$ through $130_{n2}$ of the processor arrangement 120 are connected to corresponding receivers and transmitters of the channel interfaces, channel interface $125_a$ through channel interface $125_n$ (collectively referred to as channel interfaces 125), namely, receiver $135_a$ through receiver $135_n$ (collectively referred to as receivers 135) and transmitter $136_a$ through transmitter $136_n$ (collectively referred to as transmitters 136). In the preferred embodiment, depending upon the functions implemented, each of the receivers $135_a$ through $135_n$ may include a Motorola M68302 processor, a Motorola 56000 series digital signal processor, a ZIF SYN integrated circuit, and an LSI Logic L64714 (Reed-Solomon decoder), for demodulation and for decoding forward error correction and cyclic redundancy checks. In the preferred embodiment, also depending upon the functions implemented, each of the transmitters $136_a$ through $136_n$ may include a field programmable gate array which performs various digital signal processing functions, a ZIF SYN integrated circuit, and an LSI Logic L64711 (Reed-Solomon encoder), for modulation and for coding for forward error correction and cyclic redundancy checks. As a consequence, as used herein, the channel interfaces 125 may be considered to perform the functions of data and other signal reception and transmission, regardless of the specific hardware implementations and additional functions which may or may not be implemented. The various memories illustrated, such as memory 122 or $131_{a1}$, may also be embodied or contained within their corresponding processors, such as master controller 121 or processor $130_{a1}$. In addition, the various memories illustrated, such as memory 122 or $131_{al}$, similarly to memory 155 discussed with reference to FIG. 3, may also contain different types of memory, implemented in commercially available integrated circuits, such as random access memory, which is one of the types of memory referred to herein as a working memory; non-volatile memory, which is one of the types of memory referred to herein as a limited write memory; and flash-type memory. As discussed in greater detail below, the various processors of the apparatus of FIG. 2 may also include a write operation counter, which may be implemented within the processor's program instructions, and which is utilized to track or account for the total number of write operations performed in the limited write memory, for example, through incrementation of the stored count. The functions of these various components with respect to the present invention are explained in greater detail below with reference to FIGS. 4 through 7.

Figure 3:
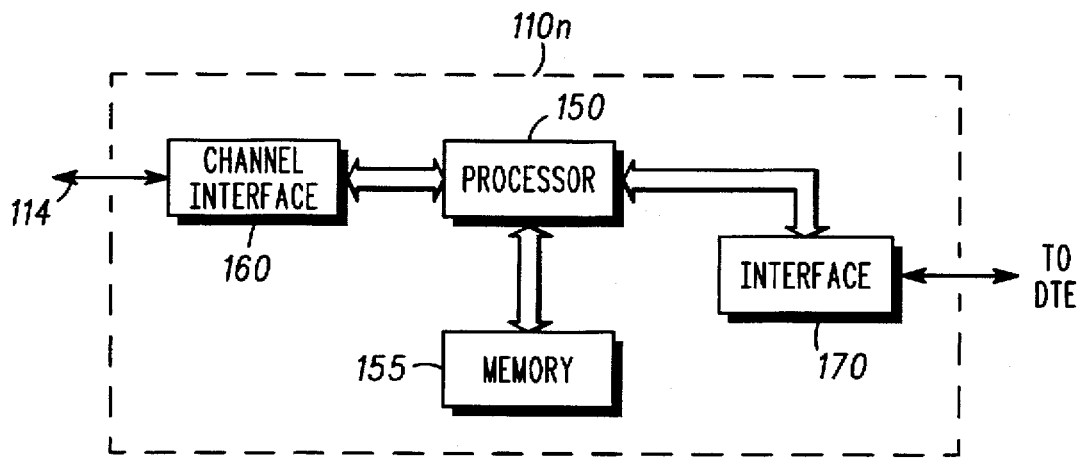
FIG. 3 is a block diagram illustrating a secondary station apparatus in accordance with the present invention.

FIG. 3 is a block diagram illustrating a secondary station $110_n$ in accordance with the present invention. The secondary station $110_n$ includes a processor 150, with the processor 150 having or coupled to a memory 155. In the preferred embodiment, the processor 150 is a Motorola M68302 processor (also known as an integrated multiprotocol processor), and the memory 155 is 256 kilobyte RAM.

The processor 150 is coupled to an interface 170, such as an ethernet port or an RS232 interface, for connection to a computer, a workstation, or other data terminal equipment. The processor 150 is also coupled to a channel interface 160 for communication over the communication medium 114. The channel interface 160, in the preferred embodiment, depending upon the functions implemented, includes a Motorola M68HC11 integrated circuit, a ZIF SYN integrated circuit, a Broadcom BCM3100 QAMLink integrated circuit, a Motorola TxMod integrated circuit, and LSI Logic L64711 and L64709 integrated circuits, and performs such functions as forward error correction encoding and decoding, QAM demodulation (for downstream reception), π/4-DQPSK modulation (for upstream transmission), transmit level and frequency adjustment, for data and other signal reception and transmission. As a consequence, as used herein, the channel interface 160 may be considered to perform the functions of data and other signal reception and transmission, regardless of the specific hardware implementations and additional functions which may or may not be implemented. The memory illustrated as memory 155 may also be embodied or contained within the corresponding processor 150. In the preferred embodiment, the memory 155 includes, as separate integrated circuits, three types of memory, namely, a working memory such as a random access memory, a limited write memory such as a non-volatile memory, and flash memory, which may be implemented utilizing known, commercially available ICs. In the preferred embodiment, the limited write (write operation) memory ICs include a flash programmable ROM, AMD 29F040, an $E^2$PROM, XICOR X25040S, and $E^2$-type memory within the Motorola 68HC11 integrated circuit. As discussed above with regard to FIG. 2, and also as explained in greater detail below, the processor 150 of the apparatus of FIG. 3 may also include a write operation counter, which may be implemented within the processor's program instructions, and which is also utilized to track or account for the total number of write operations performed in the limited write memory. The additional functions of these components of the secondary station $110_n$ with respect to the invention are also described in greater detail below with reference to FIGS. 4 through 7.

In the preferred apparatus embodiment illustrated in FIG. 3, the memory utilization and management method discussed below with reference to FIGS. 4 through 7 may be programmed and stored, as a set of program instructions for subsequent execution, in the processor 150 and memory 155 of a secondary station 110, such as secondary station $110_n$ illustrated in FIG. 3. To the extent that any memory management capability is necessary or desirable within a primary station, such as primary station 101 illustrated in FIG. 2, the memory management method may be programmed and stored, also as a set of program instructions for subsequent execution, in the primary station 101 illustrated in FIG. 2 and, more particularly, in the processor arrangement 120, and more particularly, in the master controller 121 (with its associated memory 122) and in each of the processors 130 (with their associated memories 131).

Figure 4:
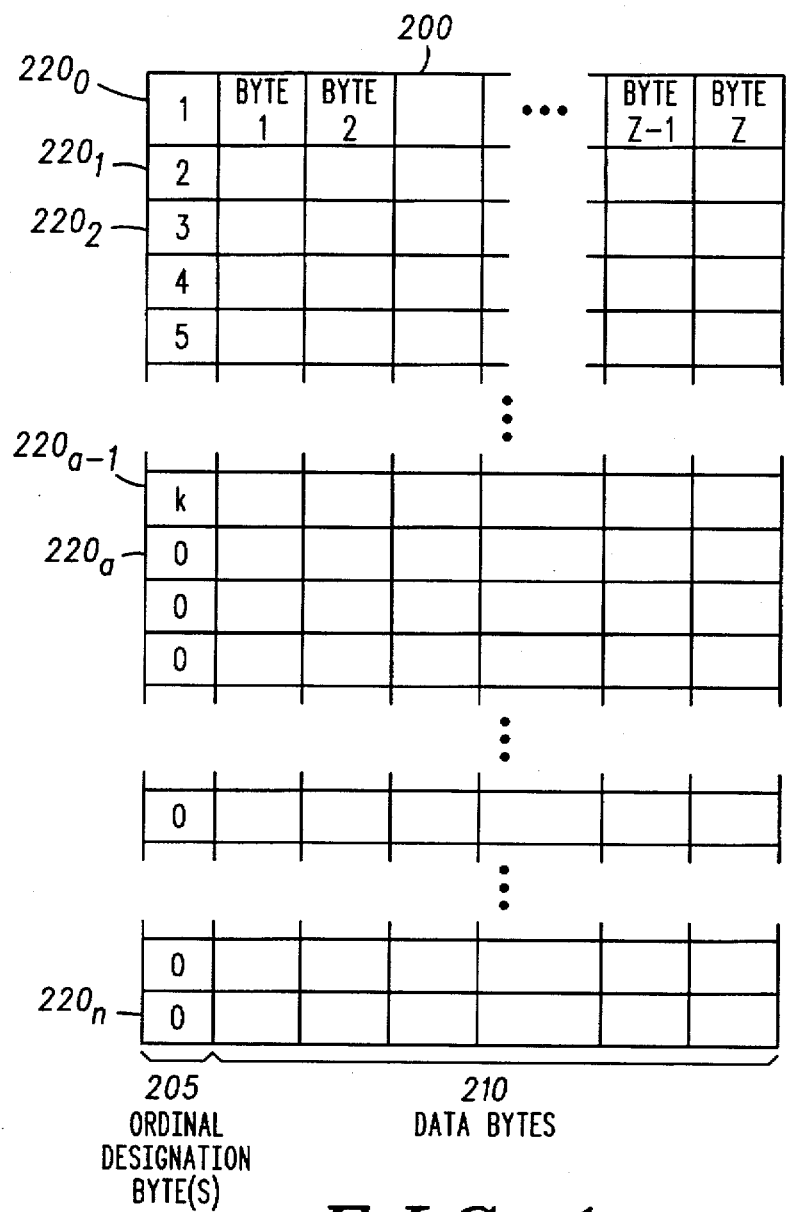
FIG. 4 is a block diagram illustrating a memory structure in accordance with the present invention.

FIG. 4 is a block diagram illustrating a memory structure 200 in accordance with the present invention. As mentioned above, such a memory structure 200 may be embodied within an $E^2$Prom or other form of non-volatile memory in, for example, a secondary station 110. In FIG. 4, the memory structure is illustrated as an array, such as a matrix of rows $220_0$ through $220_n$ (collectively rows or row 220), with the first column (column 205) of each such row 220 allocated for ordinal bytes (or ordinal designations), and with remaining columns (columns 210) of each such row 220 allocated for "z" data bytes (byte 1 through byte z), such as channel and power level information. In the preferred embodiment, upon the first secondary station initialization, when it is powered up and enters the communication system 100 for the first time, all ordinal bytes are or have been initialized to zero. Thereafter, as data bytes are written into rows 220 of the memory structure 200, the ordinal is incremented, thereby indicating which row most recently has had data written into it, for a current read operation, and which is the next row for data to be written into during the next write operation. In the preferred embodiment, the ordinal is incremented in a modulo (x) method, namely, to a maximum value of x−1, with additional incrementation returning to zero, followed by incrementing again to x−1 and repeating the process. For example, in the preferred embodiment, one byte is utilized for the ordinal values, resulting in counting from zero to 255. As a consequence, in the preferred embodiment using the one byte ordinal, 255 (or less) is the maximum corresponding number of rows 220 of the memory structure 200. If more rows are necessary or desirable, then the size of the ordinal should be increased correspondingly, for example, to two bytes. As illustrated in FIG. 4, the first "a" rows (rows $220_0$ through $220_{(a-1)}$ have had data bytes written into those memory locations, and the remaining "n−a" rows (rows $220_a$ through $220_n$) have not, as indicated by the zero in the first column of each row $220_a$ through $220_n$. As more data is written into the memory structure 200, however, it may be expected that each of these remaining rows will subsequently have data written into them, followed by "wrapping around" and returning to the first row $220_0$ and, sequentially, writing over the data previously stored with new data, as needed, in each successive row of the rows $220_0$ through $220_n$. By successively wrapping around the memory structure, the number of write operations to each row 220 of the memory structure may be tracked or otherwise accounted for, resulting in utilization of each limited write memory location to its fullest or maximum extent (allowable number or write operations).

Figure 5:
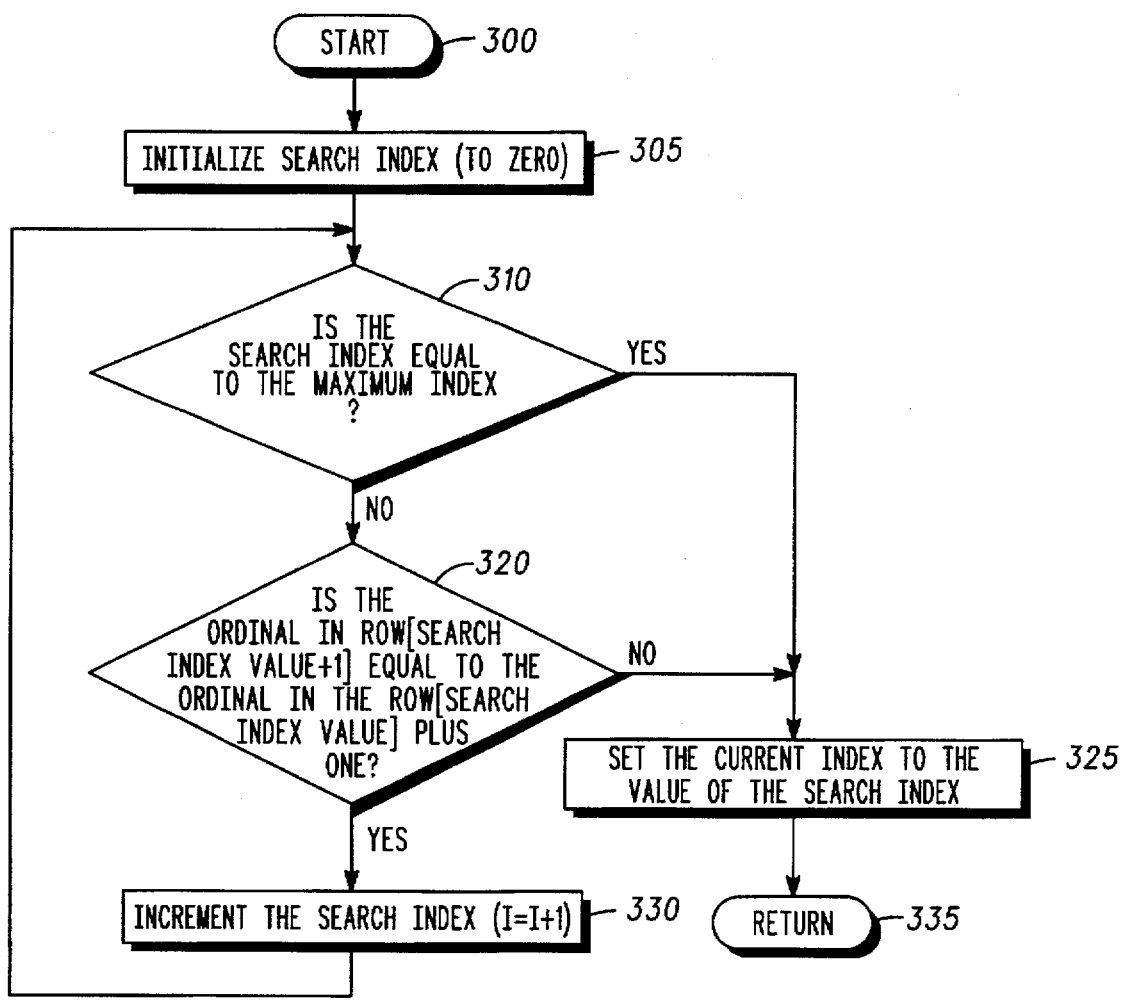
FIG. 5 is a flow chart illustrating a search method for memory utilization, upon system initialization, in accordance with the present invention.

FIG. 5 is a flow chart illustrating a search method for memory utilization, upon system initialization, in accordance with the present invention. In the preferred embodiment, the search method is performed only upon such system initialization or start up, when the device (such as a secondary station 110) is powered up or turned on, and is utilized to determine the location (row) of the last write operation (referred to as the current index) performed during the last session (i.e., the most recent previous session) in which the device was powered on and utilized, and the location (row) for the next write operation (referred to as the next index) during the current session. Thereafter, throughout the current session or time period during which the device is powered on, the location (row) of the last write operation (the current index), and the location (row) for the next write operation (the next index), may be maintained and stored as variables in volatile memory, such as RAM, for each read and write operation.

Referring to FIG. 5, beginning with start step 300, the method initializes a search index, step 305. In the preferred embodiment, the search index is or corresponds to a row number of the memory structure 200, and is initialized by setting the search index to zero, so that the method begins the search process with the first row of the memory structure 200, such as row $220_0$. As discussed in greater detail below, each row and its next, adjacent row of the memory structure 200 will be searched sequentially, as a pair of adjacent rows. As indicated above, as data is written into a (next) row, its ordinal (in column 205) is incremented from the current ordinal value (the ordinal value of the most current row into which data has been written). As a consequence, as adjacent rows are searched sequentially, if both the first and second (next) row (of the adjacent rows) have already had data written into them, their ordinal values will be sequential, such as the ordinal "k" in the first row followed by ordinal (k+1 in the second row of the pair of adjacent rows. If the second of the rows has not yet had data written into it (during the current iteration of writing into sequential rows of the memory structure), its ordinal value will not be sequential (from the ordinal value of the first row), but will indicate a discontinuity or gap, such as ordinal "k" in the first row followed by ordinal (k+ or −n) in the second row (for a memory structure having n rows). For example, in a memory structure having 20 rows, the ordinal value in the first row of the pair of adjacent rows may be 212, and the ordinal value in the second row may be 192. In such a case, the first such row is the row having the most current information, and the second row is the next row to which data should be written. Accordingly, when the last row (such as row $220_n$) of the memory structure 200 is reached without finding such a discontinuity, i.e., all other rows have been searched and each adjacent row has incremental ordinal values, then the last row is the row having current data and the first row (such as row $220_0$) will be the next row to which data should be written. As a consequence, following step 305, in step 310, if the search index is equal to the last row, i.e., the search index is equal to the maximum index value (also referred to as the maximum index) (such as 19 with 20 rows numbered 0 to 19), then the method proceeds to step 325 discussed below, in which the current index is set equal to the value of the search index (in this case the maximum index value). In step 310, if the search index is not equal to the last row (i.e., the search index is not equal to the maximum index value), but is equal to another row value, then the method proceeds to step 320. In step 320, as discussed above, adjacent rows are examined to determine whether the ordinal in the second row of the adjacent rows is the next incremented value from the ordinal in the first row of the adjacent rows, i.e., where the increment value of the ordinal is one, is the ordinal in row [search index plus one] equal to (the ordinal in row [search index] plus one). If in step 320 the ordinal in the second row is the next incremented value from the ordinal in the first row, i.e., the ordinal in row [search index plus one] is equal to (the ordinal in row [search index] plus one), indicating that both rows have already been written to, then the search index is incremented in step 330 (search index I= search index I+1), and the method repeats to examine the next pair of adjacent rows, returning to step 310.

Continuing to refer to FIG. 5, if in step 320 the ordinal in the second row is not the next incremented value from the ordinal in the first row, i.e., the ordinal in row [search index plus one] is not equal to (the ordinal in row [search index] plus one), indicating a discontinuity such that the second row of the pair of adjacent rows is the next row to which data should be written, then the method proceeds to step 325.

Figure 6:
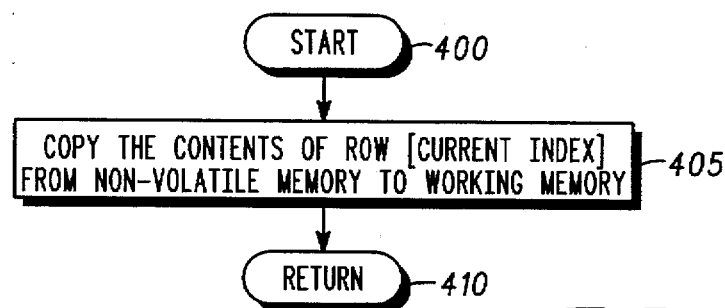
FIG. 6 is a flow chart illustrating a method for a read operation in accordance with the present invention.
Figure 7:
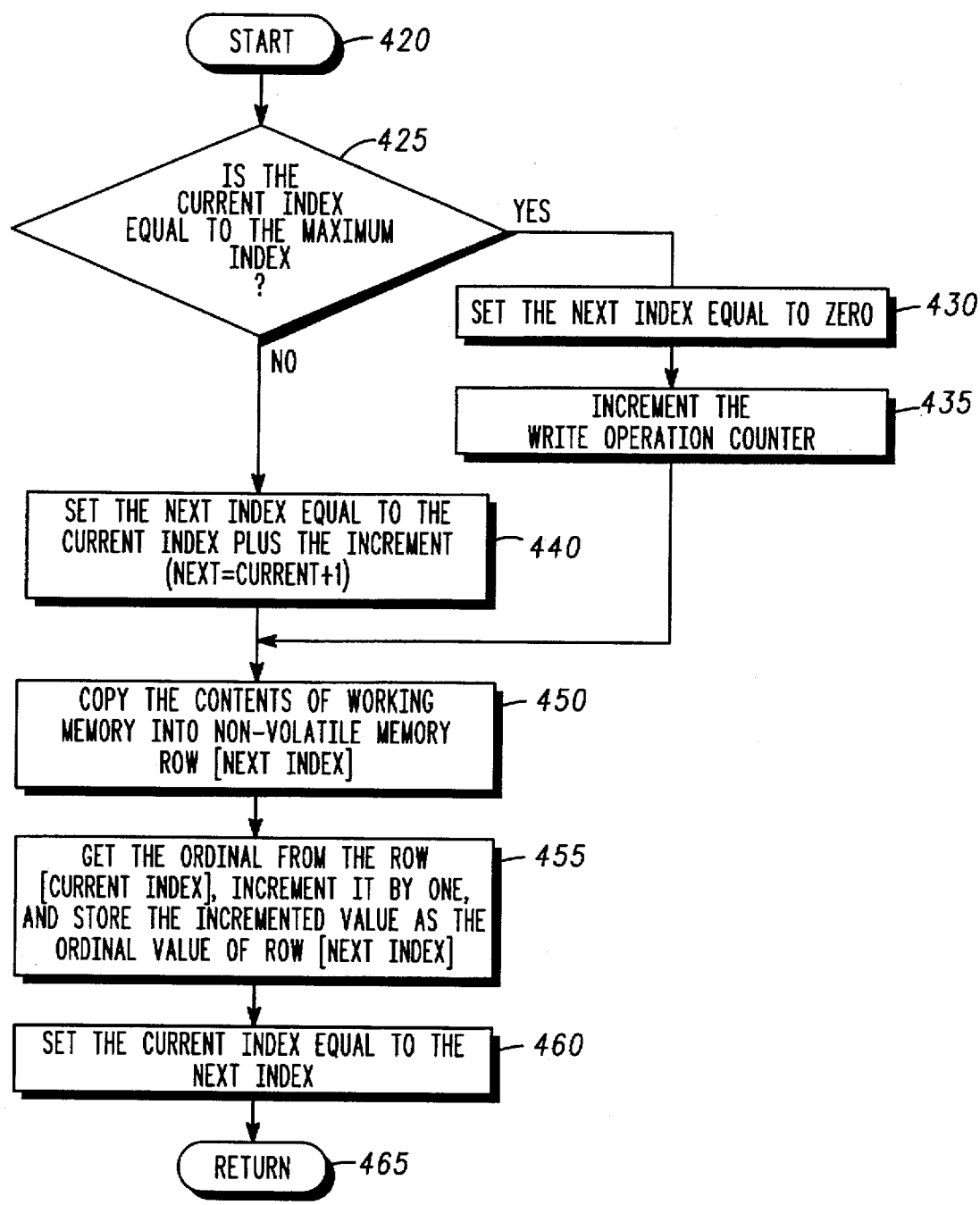
FIG. 7 is a flow chart illustrating a method for a write operation in accordance with the present invention.

In step 325, the current row value, referred to as the current index, which will be utilized in the read and write operations discussed below with reference to FIGS. 6 and 7, is set equal to the value of the search index, so that the value of the current index identifies the particular row in memory storing the most current information (from the previous session). The search method may then stop, return step 335.

FIG. 6 is a flow chart illustrating a method for a read operation in accordance with the present invention. As indicated above, the row into which the most current data has been written is tracked utilizing the current index value. As a consequence, as illustrated in FIG. 6, beginning with start step 400, a read operation is performed by copying the contents of row [current index] from non-volatile memory into working memory, such as RAM, step 405. The read operation is then complete, return step 410. The method illustrated in FIG. 6 would also be repeated for each read operation, returning to step 400.

FIG. 7 is a flow chart illustrating a method for a write operation in accordance with the present invention. As indicated above, the current index tracks the row into which data has been written most recently, and the next index tracks the next row into which data should be written. Beginning with start step 420, in the preferred embodiment, the method determines whether the current index is equal to the maximum index (or maximum index value), step 425. This step is utilized in the preferred embodiment to determine whether the next write location is to be "wrapped around" the memory structure 200, from the last row back to the first row. Accordingly, when the current index is equal to the maximum index in step 425, indicating that data has already been written into the last row of the memory structure 200 (in the current iteration of the write operation method, or during a previous session (when the search index is set equal to the maximum index in step 315 of FIG. 5)), the method will wrap around to the first row by setting the next index equal to the first row, such as row zero (e.g., row 220$_0$), step 430. In the preferred embodiment, the number of times the method has returned to or wrapped around to the first row is utilized to track overall memory usage, because whenever the method returns to the first row, it indicates that data has been written into all rows of the memory structure, and in returning to the first row, new data will subsequently be written over the existing data in each row. As a consequence, in step 435, each time the method wraps around and returns to the first row, a write operation counter is incremented, to track the total number of write operations per row made to the memory structure. When the write operation counter approaches the maximum number of write operations of the limited write memory, an indication may be provided that the memory may need replacement. Following step 435, the method proceeds to step 450, discussed below.

Continuing to refer to FIG. 7, when the current index is not equal to the maximum index in step 425, indicating that the method does not need to wrap around to the first row, then in step 440, the method sets the next index equal to the current index plus the increment value, such as setting the next index equal to the current index plus one. Following steps 440 and 435, in step 450, writing to the memory structure 200 is then performed by copying the contents of working memory, such as RAM, into the next row of non-volatile memory, namely, row [next index]. Next, in step 455, the method then gets or reads the ordinal from the row previously having the most current data (the row having the current data prior to the writing step 450), i.e., the row [current index], increments the ordinal (e.g., next ordinal= current ordinal+1), and stores the incremented value as the ordinal value of the next row into which data was just written in step 450, i.e., row [next index]. Next, the current index is set equal to the next index, step 460, and the write operation methodology is complete, return step 465. In the preferred embodiment, step 450 precedes step 455, because if these steps were in another order and an event occurred such as a power outage which prevented the new data from being stored after the ordinal was incremented, then the search procedure of FIG. 5 would incorrectly use the next row (having the incremented ordinal), but the next row would not yet have had correct information stored in it (in step 450) resulting, in subsequent read operations, of potentially erroneous information being read rather than previous information. The method illustrated in FIG. 7 would also be repeated for each write operation, returning to step 420.

Other variations of the present invention may also be utilized. There may be countless equivalent variations upon incrementation methods, such as decrementation or some other form of counting. For example, the search methodology illustrated in FIG. 5 may be implemented equivalently by initializing the search index value to the maximum index, followed by decrementing the search index value, with corresponding comparisons accounting for decremented rather than incremented values. Also for example, in a current and alternative embodiment of the invention, instead of incremented ordinals, there may be various invalid numbers or parameters, such as a hexadecimal FF, which may be used as a pointer or flag to indicate the next memory location into which data may be written. For example, following the last memory location into which data was written, the invalid parameter may be written into the next byte location, as a flag to indicate the beginning of the next memory location into which data should be written in the next write operation. In the next write operation, that invalid parameter flag is written over by the new data, followed again by writing the invalid parameter into the next byte location following the data to indicate the next consecutive memory location. The search methodology of FIG. 5 is then modified to look for the row (or other memory location) having the invalid parameter, setting the next index equal to the row having the invalid parameter, and setting the current index equal to the row preceding the invalid parameter. In contrast with the preferred methodology, this methodology may not be used if an invalid parameter is not available. In addition, depending upon the number of data bytes being written, there may be additional overhead write operations associated with writing the invalid parameter, which itself utilizes the limited write memory. In general, to obtain the additional write operations of the present invention (in either the preferred or alternative embodiments), some additional overhead bytes are added, either ordinals or other parameters, resulting in the utilization of additional memory locations in order to obtain the additional write operations. For example, if the ordinal is one byte and twenty data bytes are utilized, then the additional overhead from use of the ordinal is only five percent. Such additional memory locations are typically available in commercial integrated circuits, however, which tend to be manufactured in specific or standard sizes, resulting in potentially excess location capacity for a given application.

In summary, FIGS. 4-7 disclose a method for utilization of a limited write memory, the method comprising: first, defining an array structure in the limited write memory 200, the array structure including a plurality of rows 220 for storing data, each row of the plurality of rows having an ordinal designation of a plurality of ordinal designations 205; second, reading data from the limited write memory by copying data stored in a first row of the plurality of rows into a working memory, the first row having a first ordinal designation of the plurality of ordinal designations, the first row having a value equal to a current index value (step 405); and third, writing data into the limited write memory by copying data stored in the working memory into a second row of the plurality of rows, the second row having a second ordinal designation of the plurality of ordinal designations, the second row having a value equal to a next index value (step 455).

In addition, as disclosed in FIG. 5, the method may also include initializing a search index value (step 305); determining whether the search index value is equal to a maximum index value (step 310); when the search index value is equal to the maximum index value in step 310, setting the current index value equal to the search index value (step 325) (which is the maximum index value); when the search index value is not equal to the maximum index value in step 310, sequentially examining a pair of adjacent rows of the plurality of rows, each pair of adjacent rows having a first adjacent row corresponding to the search index value and having a second adjacent row corresponding to an incremented search index value, the first adjacent row having a first adjacent row ordinal designation of the plurality of ordinal designations and the second adjacent row having a second adjacent row ordinal designation of the plurality of ordinal designations (step 320); when the second adjacent row ordinal designation is equal to an increment of the first adjacent row ordinal designation value in step 320, incrementing the search index value and returning to step 310 (step 330), and when the second adjacent row ordinal designation value is not equal to the increment of the first adjacent row ordinal designation value in step 320, setting the current index value equal to the search index value (step 325). Also as disclosed in FIG. 7, the write operation may include determining whether the current index value is equal to the maximum index value (step 425); when the current index value is not equal to the maximum index value, setting the next index value equal to an increment of the current index value (step 440); copying data stored in the working memory into the second row (step 450); incrementing the first ordinal designation to form the second ordinal designation (step 455); resetting the current index value to equal the next index value (step 460); and when the current index value is equal to the maximum index value, setting the next index value equal to an initial value (step 430) and incrementing a write operation counter (step 435).

Also in summary, as discussed above, an alternative embodiment for the method for utilization of a limited write memory, may comprise: defining an array structure in the limited write memory, the array structure including a plurality of rows for storing data; reading data from the limited write memory by copying data stored in a first row of the plurality of rows into a working memory, the first row having an invalid parameter following the data stored in the first row; writing data into the limited write memory by copying data stored in the working memory into a second row of the plurality of rows commencing at a location corresponding to the invalid parameter; and writing the invalid parameter into the limited write memory following the data copied into the second row.

Also in summary, FIGS. 4–7, in conjunction with FIGS. 2 and 3, disclose an apparatus for utilization of a limited write memory, the apparatus comprising, as part of memory 155, a working memory and a limited write memory, the limited write memory having an array structure, the array structure including a plurality of rows for storing data, each row of the plurality of rows having an ordinal designation of a plurality of ordinal designations; and a processor (150, 130, or processor arrangement 120) coupled to the limited write memory and to the working memory, the processor responsive through a set of program instructions to read data from the limited write memory by copying data stored in a first row of the plurality of rows into the working memory, the first row having a first ordinal designation of the plurality of ordinal designations, the first row having a value equal to a current index value, and the processor further responsive to write data into the limited write memory by copying data stored in the working memory into a second row of the plurality of rows, the second row having a second ordinal designation of the plurality of ordinal designations, the second row having a value equal to a next index value.

As may be apparent from the above discussion, the apparatus and method of the present invention provide a significant increase or expansion in the ability to fully use limited write memories. For example, if twenty rows in a memory array are utilized, such as in memory structure 200, and if each memory location may have 100,000 write operations, then the apparatus and method of the present invention expand the number of allowed write operations by a factor of twenty, namely, to 2,000,000, at a cost, for example, of 5% additional limited write memory overhead. In contrast with the prior art avoidance of utilization of such limited write memories, this expansion of allowable memory utilization in accordance with the present invention enables increased and more optimal system performance, such as a greater fine tuning of transmission parameters in a communication system, including adjustment of power levels and channel reassignment and reallocation.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims. The invention is further defined by the following claims.

What is claimed is:

1. A method for storing a parameter in a limited write memory, the method comprising the steps of:

defining an array structure in the limited write memory, the array structure including a plurality of sequential rows for storing data, each row including an ordinal field and a data field;

storing the parameter in the data field of a selected row of the plurality of rows; and storing in the ordinal field of the selected row a value indicating that the parameter is stored in the selected row.

2. The method of claim 1 wherein the value indicating that the parameter is stored in the selected row exceeds a value stored in the ordinal field of an immediately preceding row by one and exceeds a value stored in the ordinal field of an immediately following row by more than one.

3. The method of claim 1 wherein:

the value indicating that the parameter is stored in the selected row exceeds the value stored in the ordinal field of the immediately preceding row by one if the value indicating that the parameter is stored in the selected row is equal to the value stored in the ordinal field of the immediately preceding row plus one modulo x; and the value indicating that the parameter is stored in the selected row exceeds the value stored in the ordinal field of the immediately following row by more than one if the value stored in the ordinal field of the immediately following row is unequal to the value indicating that the parameter is stored in the selected row plus one modulo x; where x is one more than a predetermined maximum value to be stored in the ordinal field of any of the plurality of rows.

4. The method of claim 2 wherein the immediately preceding row is one of:

the last row of the plurality of rows, if the selected row is the first row of the plurality of rows; and a row sequentially preceding the selected row, if the selected row is a row other than the first row of the plurality of rows.

5. The method of claim 2 wherein the immediately following row is one of:

the first row of the plurality of rows, if the selected row is the last row of the plurality of rows; and a row sequentially following the selected row, if the selected row is a row other than the last row of the plurality of rows.

6. In a limited write memory having an array structure for storing a parameter, the array structure including a plurality of sequential rows for storing data, each row including an ordinal field and a data field, a method for determining a current row having a most recently stored parameter value, the method comprising the steps of:

(a) selecting as the current row the first row of the plurality of rows;

(b) determining whether the current row is equal to the last row of the plurality of rows; and (c) if the current row is equal to a row other than the last row:
  (c1) determining a next row adjacent to the current row;
  (c2) determining whether the ordinal field of the current row is equal to one less than the ordinal field of the next row; and
  (c3) if the ordinal field of the current row is equal to one less than the ordinal field of the next row, recycling to step (b) with the current row equal to the next row.

7. The method of claim 6 wherein the first row of the plurality of rows is indexed by an initial index value and the last row of the plurality of rows is indexed by a maximum index value, and wherein:
  the step of selecting as the current row the first row of the plurality of rows comprises setting a current index equal to the initial index value;
  the step of determining whether the current row is equal to the last row of the plurality of rows comprises determining whether the current index is equal to the maximum index value;
  the step of determining the next row comprises setting a next index equal to the current index plus one; and
  the step of recycling to step (b) with the current row equal to the next row comprises setting the current index equal to the next index.

8. In a limited write memory having an array structure for storing a parameter, the array structure including a plurality of sequential rows for storing data, each row including an ordinal field and a data field, wherein the parameter is stored in a current row of the plurality of rows, a method for storing a new parameter value in the limited write memory, the method comprising the steps of:
  determining a next row sequentially following the current row;
  writing the new parameter value into the data field of the next row; and
  storing in the ordinal field of the next row a value one greater than the ordinal field of the current row.

9. The method of claim 8 wherein the step of determining the next row comprises the steps of:
  determining whether the current row is equal to the last row;
  if the current row is a row other than the last row, selecting as the next row the row sequentially following the current row; and
  if the current row is equal to the last row, selecting as the next row the first row of the plurality of rows.

10. The method of claim 9 further comprising the step of:
  updating the current row to be the next row after storing the value in the ordinal field of the next row.

11. The method of claim 9 further comprising the step of:
  incrementing a write operation counter if the current row is equal to the last row.

12. The method of claim 8 wherein the first row of the plurality of rows is indexed by an initial index value, the last row of the plurality of rows is indexed by a maximum index value, and the current row is indexed by a current index, and wherein the step of determining the next row comprises the steps of:
  determining whether the current index is equal to the maximum index value;
  if the current index is equal to the maximum index value, setting a next index equal to the initial index value;
  if the current index is less than the maximum index value, setting the next index equal to the current index plus one; and
  selecting as the next row the row indexed by the next index.

13. The method of claim 12 further comprising the step of:
  setting the current index equal to the next index after storing the value in the ordinal field of the next row.

14. The method of claim 12 further comprising the step of:
  incrementing a write operation counter if the current index is equal to the maximum index value.

15. The method of claim 8 wherein the step of storing the value in the ordinal field of the next row comprises the steps of:
  reading an ordinal value stored in the ordinal field of the current row;
  if the ordinal value is less than a predetermined maximum ordinal value, selecting the value to be equal to the ordinal value plus a predetermined increment; and
  if the ordinal value is equal to the predetermined maximum ordinal value, selecting the value to be equal to zero.

16. The method of claim 15 wherein the predetermined increment is equal to one.

17. The method of claim 15 wherein the predetermined maximum ordinal value is equal to the largest number that can be stored in the ordinal field.

18. An apparatus for storing a parameter, the apparatus comprising:
  a limited write memory for storing the parameter;
  logic for defining within the limited write memory an array structure having a plurality of rows, each row including an ordinal field and a data field;
  logic for determining a current row having a most recently stored parameter value according to the ordinal field of the plurality of rows;
  logic for determining a next row sequentially following the current row;
  logic for writing the parameter into the data field of the next row; and
  logic for storing in the ordinal field of the next row a value one greater than the ordinal field of the current row.

* * * * *